United States Patent
Sheffield

(10) Patent No.: US 12,198,365 B2
(45) Date of Patent: *Jan. 14, 2025

(54) SPATIAL CONSTRUCTION USING GUIDED SURFACE DETECTION

(71) Applicant: Lowe's Companies, Inc., Mooresville, NC (US)

(72) Inventor: Mason E. Sheffield, Woodinville, WA (US)

(73) Assignee: Lowe's Companies, Inc., Mooresville, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/154,662

(22) Filed: Jan. 13, 2023

(65) Prior Publication Data

US 2023/0154027 A1    May 18, 2023

Related U.S. Application Data

(63) Continuation of application No. 16/866,801, filed on May 5, 2020, now Pat. No. 11,580,658, which is a
(Continued)

(51) Int. Cl.
*G06T 7/593* (2017.01)
*G06F 30/12* (2020.01)
(Continued)

(52) U.S. Cl.
CPC .............. *G06T 7/593* (2017.01); *G06F 30/12* (2020.01); *G06F 30/17* (2020.01); *G06F 30/20* (2020.01);
(Continued)

(58) Field of Classification Search
CPC .......... G06T 7/593; G06T 17/20; G06T 7/13; G06T 17/00; G06T 2200/04;
(Continued)

(56) References Cited

U.S. PATENT DOCUMENTS 5,862,252 A    1/1999  Yamamoto et al.
6,025,847 A    2/2000  Marks
(Continued)

FOREIGN PATENT DOCUMENTS

CN    104866691 A    8/2015
WO    2019226560 A1  11/2019

OTHER PUBLICATIONS

CA3,099,748, "Notice of Allowance", Mar. 2, 2023, 1 page.
(Continued)

*Primary Examiner* — YuJang Tswei
(74) *Attorney, Agent, or Firm* — Kilpatrick Townsend & Stockton LLP

(57) ABSTRACT

Described herein are a system and methods for efficiently using depth and image information for a space to generate a 3D representation of that space. In some embodiments, an indication of one or more points is received with respect to image information, which is then mapped to corresponding points within depth information. A boundary may then be calculated to be associated with each of the points based on the depth information at, and surrounding, each point. Each of the boundaries are extended outward until junctions are identified as bounding the boundaries in a direction. The system may determine whether the process is complete or not based on whether any of the calculated boundaries are currently unlimited in extent in any direction. Once the system determines that each of the boundaries is limited in extent, a 3D representation of the space may be generated based on the identified junctions and/or boundaries.

20 Claims, 9 Drawing Sheets

Related U.S. Application Data continuation of application No. 15/988,891, filed on May 24, 2018, now Pat. No. 10,679,372.

(51) Int. Cl.

| | | |
|---|---|---|
| *G06F 30/13* | (2020.01) | |
| *G06F 30/17* | (2020.01) | |
| *G06F 30/20* | (2020.01) | |
| *G06T 7/13* | (2017.01) | |
| *G06T 17/00* | (2006.01) | |
| *G06T 17/20* | (2006.01) | |

(52) U.S. Cl.
CPC .............. *G06T 17/20* (2013.01); *G06F 30/13* (2020.01); *G06T 7/13* (2017.01); *G06T 17/00* (2013.01); *G06T 2200/04* (2013.01); *G06T 2207/10028* (2013.01); *G06T 2210/04* (2013.01)

(58) Field of Classification Search
CPC ....... G06T 2207/10028; G06T 2210/04; G06F 30/17; G06F 30/20; G06F 30/12; G06F 30/13
See application file for complete search history.

(56) References Cited

U.S. PATENT DOCUMENTS

| | | | |
|---|---|---|---|
| 6,201,546 B1 | 3/2001 | Bodor et al. | |
| 6,661,914 B2 | 12/2003 | Dufour | |
| 6,816,819 B1 | 11/2004 | Loveland | |
| 7,127,378 B2 | 10/2006 | Hoffman et al. | |
| 7,523,411 B2 | 4/2009 | Carlin | |
| 7,728,833 B2 | 6/2010 | Verma et al. | |
| 8,055,046 B2 * | 11/2011 | Feilkas | G06T 7/50 382/131 |
| 8,244,508 B1 * | 8/2012 | Dean | G06T 17/10 700/98 |
| 8,611,694 B2 | 12/2013 | Kogan et al. | |
| 8,682,045 B2 | 3/2014 | Vining et al. | |
| 9,245,382 B2 | 1/2016 | Zhou et al. | |
| 9,292,969 B2 | 3/2016 | Laffargue et al. | |
| 9,787,904 B2 | 10/2017 | Birkler et al. | |
| 10,679,372 B2 | 6/2020 | Sheffield | |
| 11,580,658 B2 | 2/2023 | Sheffield | |
| 2008/0246759 A1 | 10/2008 | Summers | |
| 2010/0275018 A1 | 10/2010 | Pedersen | |
| 2011/0187713 A1 | 8/2011 | Pershing et al. | |
| 2012/0323247 A1 * | 12/2012 | Bettenga | A61F 2/46 606/91 |
| 2013/0004179 A1 * | 1/2013 | Nielsen | H04B 3/50 398/115 |
| 2013/0293539 A1 | 11/2013 | Hunt et al. | |
| 2014/0125654 A1 | 5/2014 | Oh | |
| 2014/0267717 A1 | 9/2014 | Pitzer et al. | |
| 2014/0282783 A1 * | 9/2014 | Totten | H04N 21/61 725/111 |
| 2014/0333615 A1 | 11/2014 | Ramalingam et al. | |
| 2015/0049170 A1 | 2/2015 | Kapadia et al. | |
| 2015/0116509 A1 | 4/2015 | Birkler et al. | |
| 2015/0153444 A1 * | 6/2015 | Nichols | G01S 13/86 342/385 |
| 2015/0161818 A1 | 6/2015 | Komenczi et al. | |
| 2015/0170260 A1 | 6/2015 | Lees et al. | |
| 2015/0193971 A1 | 7/2015 | Dryanovski et al. | |
| 2015/0242542 A1 | 8/2015 | Bosdriesz | |
| 2015/0254857 A1 * | 9/2015 | Huang | G06T 19/006 382/154 |
| 2015/0312550 A1 | 10/2015 | Robert | |
| 2015/0331970 A1 | 11/2015 | Jovanovic | |
| 2016/0035538 A1 * | 2/2016 | Fukuda | H01L 22/12 250/307 |
| 2016/0071318 A1 | 3/2016 | Lee et al. | |
| 2016/0092608 A1 | 3/2016 | Yamamoto et al. | |
| 2016/0149123 A1 | 5/2016 | Park et al. | |
| 2016/0343140 A1 | 11/2016 | Ciprari et al. | |
| 2016/0371846 A1 | 12/2016 | Starns et al. | |
| 2017/0046844 A1 | 2/2017 | Jones et al. | |
| 2017/0092014 A1 | 3/2017 | Perlman et al. | |
| 2017/0161960 A1 | 6/2017 | High et al. | |
| 2017/0193694 A1 | 7/2017 | Freund et al. | |
| 2017/0301104 A1 | 10/2017 | Qian et al. | |
| 2017/0318407 A1 | 11/2017 | Meister et al. | |
| 2018/0120477 A1 * | 5/2018 | He | G01V 11/002 |
| 2018/0158251 A1 * | 6/2018 | Pasek | G06T 19/20 |
| 2018/0218513 A1 * | 8/2018 | Ho | G06T 7/579 |
| 2019/0294178 A1 * | 9/2019 | Oppermann | G01C 21/3826 |
| 2019/0362513 A1 * | 11/2019 | Sheffield | G06T 17/20 |
| 2020/0265599 A1 | 8/2020 | Sheffield | |

OTHER PUBLICATIONS

U.S. Appl. No. 15/988,891, "Final Office Action", Feb. 1, 2019, 30 pages.
U.S. Appl. No. 15/988,891, "Final Office Action", Oct. 23, 2019, 35 pages.
U.S. Appl. No. 15/988,891, "Non-Final Office Action", Aug. 27, 2018, 24 pages.
U.S. Appl. No. 15/988,891, "Non-Final Office Action", Jun. 21, 2019, 34 pages.
U.S. Appl. No. 15/988,891, "Notice of Allowance", Feb. 4, 2020, 8 pages.
U.S. Appl. No. 16/866,801, "Final Office Action", Jun. 24, 2022, 29 pages.
U.S. Appl. No. 16/866,801, "Final Office Action", Oct. 29, 2021, 39 pages.
U.S. Appl. No. 16/866,801, "Non-Final Office Action", Feb. 16, 2022, 29 pages.
U.S. Appl. No. 16/866,801, "Non-Final Office Action", Mar. 4, 2021, 38 pages.
U.S. Appl. No. 16/866,801, "Notice of Allowance", Oct. 13, 2022, 8 pages.
U.S. Appl. No. 16/866,801, "Notice of Allowance", Oct. 13, 2022, 9 pages.
Amadeo, "Google Tango Review: Promising Google Tech Debuts on Crappy Lenovo Hardware", Ars Technica, Available online at https://arstechnica.com/gadgets/2016/12/google-tango-review-promising-google-tech-debuts-on-crappy-lenovo-hardware/, Mar. 15, 2018, 9 pages.
Brennan et al., "Virtualizing Living and Working Spaces: Proof of Concept for a Biomedical Space-Replication Methodology", Journal of Biomedical Informatics vol. 57, Available online at: http://ac.els-cdn.com/S1532046415001471/1-s2.0-S1532046415001471-main.pdf?_tid=ccf847d4-7bc3-11e7-8930-00000aacb362&acdnat=1502146834_89e652ee1e1ee3672d9747963120432d, 2015, pp. 53-61.
CA3,099,748, "Office Action", Nov. 15, 2022, 4 pages.
Choi et al., "Robust Reconstruction of Indoor Scenes", Proceedings of the IEEE Conference on Computer Vision and Pattern Recognition Available online at: http://www.cv-foundation.org/openaccess/content_cvpr_2015/papers/Choi_Robust_Reconstruction_of_2015_CVPR_paper.pdf, 2015, 10 pages.
Couprie et al., "Indoor Semantic Segmentation Using Depth Information", Arxiv Preprint Arxiv:1301.3572 Available online at: https://arxiv.org/pdf/1301.3572.pdf, 2013, 8 pages.
Coxworth, "Lynx A Camera Generates 3D Models in Real Time", New Atlas, newatlas.com Available online at: http://newatlas.com/lynx-a-3D-modeling-camera/26149/, Feb. 8, 2013, 27 pages.
Delage et al., "Automatic Single-image 3D Reconstructions of Indoor Manhattan World Scenes", Robotics Research Available online at: https://pdfs.semanticscholar.org/5ea3/e6ef1012b9e7f39451364d68312595b544b8.pdf, 2007, pp. 305-321.
Geiger et al., "Joint 3D Object and Layout Inference From a Single RGB-D Image", German Conference on Pattern Recognition. Springer, Cham, Available online at: http://ww.w.cvlibs.net/publications/Geiger2015GCPR.pdf, 2015, 12 pages.

(56) References Cited

OTHER PUBLICATIONS

Gupta et al., "Aligning 3D Models to RGB-D Images of Cluttered Scenes", Proceedings of the IEEE Conference on Computer Vision and Pattern Recognition Available online at: http://www.cv-foundation.org/openaccess/content_cvpr_2015/papers /Gupta_Aligning_3D_Models_2015_CVPR_paper.pdf, 2015, 10 pages.

Hermans et al., "Dense 3D Semantic Mapping of Indoor Scenes From RGB-D Images", Robotics and Automation (ICRA), 2014 IEEE International Conference on IEEE, Available online at: http://web-info8.informatik.rwth-aachen.de/media/papers/hermans-icra-2014.pdf, 2014, 8 pages.

Izadi et al., "KinectFusion: Real-time 3D Reconstruction and Interaction Using a Moving Depth Camera", Proceedings of the 24th Annual ACM Symposium on User Interface Software and Technology, ACM, Available online at: https://www.microsoft.com/en-us/research/wp-content/uploads/2016/02/kinectfusion-uist-comp.pdf, 2011, 10 pages.

Karsch et al., "Rendering Synthetic Objects Into Legacy Photographs", ACM Transactions on Graphics (TOG). vol. 30, No. 6 Available online at: http://www.cs.jhu.edu/~misha/ReadingSeminar/Papers/Karsch11.pdf, 2011, 12 pages.

Lai et al., "Detection-based Object Labeling in 3D Scenes", Robotics and Automation (Icra), 2012 IEEE International Conference On. IEEE Available online at: http://ftp.idiap.ch/pub/courses/EE-700/material/12-12-2012/3Dobject-labelingicra-12.pdf, 2012, 8 pages.

Luongo , "Modeling a Modern Interior Scene in Blender", Envotus Tuts+, cgi.tutsplus.com Available online at: https://cgi.tutsplus.com/tutorials/modeling-a-modern-interior-scene-in-blender--cg-15294, May 18, 2012, 59 pages.

PCT/US2019/033148, "International Preliminary Report on Patentability", Dec. 3, 2020, 11 pages.

PCT/US2019/033148, "International Search Report and Written Opinion", Sep. 9, 2019, 14 pages.

Shao et al., "An Interactive Approach to Semantic Modeling of Indoor Scenes with an RGBD Camera", ACM Transactions on Graphics, vol. 31, No. 6, Nov. 2012, 12 pages.

\* cited by examiner

SPATIAL CONSTRUCTION USING GUIDED SURFACE DETECTION

CROSS-REFERENCES TO RELATED APPLICATIONS

This application is a continuation of U.S. patent application Ser. No. 16/866,801, filed May 5, 2020, which is a continuation of U.S. patent application Ser. No. 15/988,891, filed May 24, 2018, which has been granted as U.S. Pat. No. 10,679,372, issued Jun. 9, 2020, the entire contents of which are hereby incorporated by reference in its entirety for all purposes.

BACKGROUND

Three-dimensional (3D) models (e.g., 3D representations of building spaces) are often used in a number of architectural and engineering applications. As 3D models for a particular space are often not available, 3D models must be newly generated for each of these spaces. In some cases, this involves the use of a drafter, who models the space by manually using a computer aided drafting (CAD) application. A number of automated systems are also available that use laser scanners or other sensors for acquisition of 3D data. However, these systems often collect point-cloud data which includes an unnecessarily large number of data points, making these systems memory intensive and inefficient.

Systems for generating 3D models of indoor spaces face a number of additional technical challenges. For example, these systems are often unable to distinguish the space from objects within that space. In some cases, users of a system may be forced to remove objects from the space before modeling the space to obtain an accurate model. Some systems may be capable of automatically extrapolating out point cloud data to estimate the bounds of a space. However, these systems often just identify the most likely candidate for each structural feature (e.g., walls, floors, and ceilings) of the space and generate a 3D model of the space from those likely structural features. This often results in the system disregarding atypical structural features of a space as "clutter," and results in generation of a 3D model that lacks those atypical structural features. As a result, these systems are usually only able to generate 3D models of conventional spaces, making the systems unusable for a number of spaces.

Embodiments of the invention address these and other problems, individually and collectively.

BRIEF SUMMARY

Techniques described herein are directed to a system and methods for efficiently using depth information for a space to generate a 3D representation of that space. In particular, embodiments may involve obtaining both image information as well as depth information for the space. An indication of one or more points is received with respect to the image information, which is then mapped to corresponding points within depth information. The described system then calculates a boundary to be associated with each of those one or more points based on the depth information at, and surrounding, each point. Each of the boundaries are extended outward until junctions (e.g., an intersection of two boundaries) are identified as limiting the extent of the boundaries in one direction. The system may determine whether the process is complete or not based on whether any of the calculated boundaries are currently unlimited in any direction (e.g., stretch for an infinite distance in any direction). Once the system determines that the process is complete, a 3D representation of the space may be generated based on the identified junctions and/or boundaries.

One embodiment of the disclosure is directed to a method of generating a 3D representation of a space comprising receiving an indication of a number of points, each of the points corresponding to a location upon a surface of a structural feature within the space, determining, for each of the number of points, a number of corresponding boundaries that match the surface of the corresponding structural feature for at least some amount of area, identifying, from the determined number of corresponding boundaries, multiple pairs of intersecting boundaries, generating a set of junctions, wherein each junction is generated as an intersection of a pair of intersecting boundaries of the multiple pairs of intersecting boundaries, and after determining that each of the number of corresponding boundaries is completely limited in its extent by junctions within the set of junctions, generating the 3D representation of the space using the set of junctions.

Another embodiment of the disclosure is directed to a system comprising one or more camera devices, a processor, and a memory including instructions. In this system, the instructions, when executed with the processor, may cause the system to obtain, from the one or more camera devices, a depth information associated with a scene, receive an indication of a point within the depth information, calculate, using the depth information, a first boundary associated with the indicated point, determine one or more bounds for the first boundary based on at least one second boundary obtained in relation to the scene, and generate a 3D representation of the scene based at least in part on the one or more bounds.

Yet another embodiment of the disclosure is directed to an apparatus comprising a camera device configured to capture image information, a depth sensor device configured to capture depth information, a mobile application stored in a computer-readable medium. The mobile application, when executed, may cause the apparatus to receive depth information from the depth sensor which corresponds to image information captured using the camera device, receive an indication, via the image information, of a first point and a second point within the depth information, identify, using the depth information, a first boundary associated with the first point and a second boundary associated with the second point within the depth information, determine a junction as a line on which the first boundary and second boundary intersect, and cause a 3D model to be generated that includes at least the determined junction.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
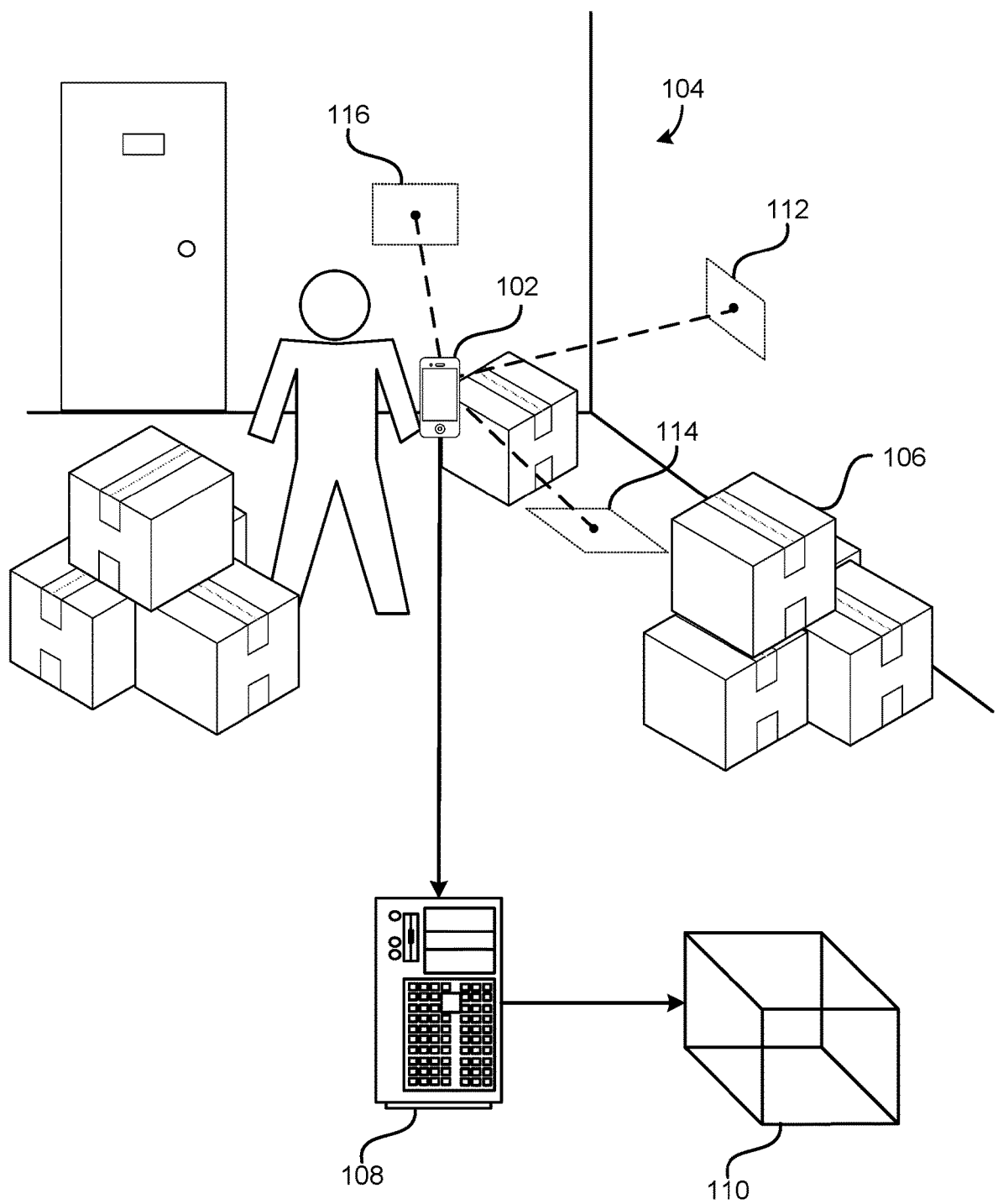
FIG. 1 depicts an illustrative overview of an example system in which guided surface detection may be used to model a cluttered 3D space in accordance with at least some embodiments.

FIG. 1 depicts an illustrative overview of an example system in which guided surface detection may be used to model a cluttered 3D space in accordance with at least some embodiments. In FIG. 1, a user device 102 is depicted as being operated within a space 104. The space 104 is depicted as including a number of obstacles 106 (e.g., clutter), which may block a view of one or more structural features (e.g., a wall, floor, or ceiling) of the space 104. The user device 102 may be in communication with a mobile application server 108.

For clarity, a certain number of components are shown in FIG. 1. It is understood, however, that embodiments of the invention may include more than one of each component. In addition, some embodiments of the invention may include fewer than or greater than all of the components shown in FIG. 1. In addition, the components in FIG. 1 may communicate via any suitable communication medium (including the internet), using any suitable communication protocol.

In some embodiments, the user device 102 may include a mobile application that, when executed, causes the user device 102 to capture input sensor data from a number of input sensors in relation to the space 104. By way of example, the user device 102 may capture image information, depth information, and geographic location information (e.g., GPS coordinates) with respect to the space 104 and/or the user device 102. Additionally, the user device 102 may be configured to display at least a portion of the obtained input information to a user. For example, a display on the user device 102 may be used to present image information captured by a camera installed on the user device 102. The image information may be obtained by the user device 102 in parallel to, and to correspond with, depth sensor output (e.g., a depth map) obtained using a depth sensor installed on the user device 102.

In some embodiments, the mobile application server 108 may be configured to receive the input sensor output from the user device 102 and generate a 3D representation 110 of the space 104. For example, the user device 102 may obtain depth information and location information from the user device 102. The mobile application server 108 may also receive an indication of at least one point selected by the user within the depth information that may be used to identify at least one boundary. In some embodiments, the mobile application server 108 may receive information related to a number of boundaries identified by the user device 102. The mobile application server 108 may then identify lines which represent junctions along which each two boundaries intersect. The 3D representation 110 may then be generated by the mobile application server 108 using this data. For purposes of this disclosure, the term "line" is not limited to a geometrically straight line. The term "line" can encompass a straight line (e.g., at the intersection of two surfaces that happen to be rectangular and planar) or can encompass curved lines or lines that are not straight in situations where a surface is curved or round or not entirely straight where the junction between surfaces otherwise is not straight.

In accordance with at least some embodiments, a user of, and/or an account associated with, the user device 102 may be identified. The account may be one that is maintained on behalf of the user by the mobile application server 108. In some embodiments, the user/account may be identified based on a phone number or serial number associated with the user device 102. In some embodiments, the user may be asked to sign into an account upon or after execution of a mobile application on the user device 102, such that any actions performed using the mobile application may be automatically associated with the logged account. In some embodiments, the identity of the user can be determined and verified more efficiently using biometric information detected by the user device 102 (e.g., finger-print or thumb-print detection, facial recognition, iris scan, or the like).

In some embodiments, the 3D representation 110 of the space 104 may include one or more measurement values for the space 104. For example, after identifying a number of junctions along which each two boundaries intersect, the mobile application server 108 may determine distances between each junction based on the provided depth information. In some embodiments, information related to the 3D representation's 110 position (e.g., orientation and location) in space may be determined. For example, the mobile application server 108 may receive location information from the user device 102. In this example, a relative location of each junction and/or boundary to the user device 102 may be determined from the depth sensor output and used (in conjunction with the user device location) to calculate a position of the 3D representation that corresponds to a position of the actual space represented by the 3D representation. The generated 3D representation may be stored in a number of ways. For example, in some embodiments, the 3D representation may be stored as a wireframe representation (e.g., only the identified junctions are stored). In some embodiments, the 3D representation may be stored as a series of boundary functions (i.e., mathematical functions that represent the surfaces identified with respect to the 3D representation).

By way of illustrating interactions between various components depicted in FIG. 1, consider a scenario in which a user enters a room (i.e., an example space 104) having a number of obstacles 106, and in which the user wishes to generate a 3D representation of the room. In this example, the user may execute a mobile application installed on his or her user device (e.g., a tablet or mobile phone). The mobile application may cause the user device to activate both a camera device and a depth sensor installed upon the user device in order to capture input related to the room. The image information captured by the camera device may be displayed upon a display of the user device. In this illustrative example, the user may select a number of points 112, 114, and 116 within the image information displayed on the user device and which correspond to actual points within the room. This can be accomplished, for example, by touching images of those points 112, 114, and 116 on a touch-screen of the user device. In some cases, the user device 102 may obtain depth information for the number of points 112, 114, and 116 as well as depth information for the area immediately surrounding those points. In some embodiments, the user device 102 may determine, from the depth information a number of boundaries, each of which is associated with one of the number of points 112, 114, and 116. In these embodiments, the user device 102 may transmit an indication of the number of boundaries (e.g., a boundary function and a distance to some point on the boundary) to the mobile application server 108. In some embodiments, the user device 102 may transmit the obtained depth information to the mobile application server 108, and the mobile application server 108 may calculate the boundaries to be associated with the room. In some embodiments, the user device 102 and/or the mobile application server 108 may determine when a 3D representation is complete by determining whether each of the boundaries in the 3D representation is limited in its extent (i.e., does not extend infinitely in any direction). For example, in some embodiments the 3D representation may be determined to be complete after detecting that each boundary calculated for the room is limited in every direction by a junction. In this illustrative example, a 3D representation of the room may then be generated.

It should be noted that in the illustrative example above, the user device 102 may have installed a motion tracking camera, which tracks the relative position of the image information with respect to the user device 102. Accordingly, the user may be able to walk around the room and reposition the user device 102 while still accurately determining a relative position for each of the indicated boundaries. Additionally, because each boundary is calculated from some point indicated by the user (e.g., 112, 114, or 116), an accurate 3D representation can be generated that does not include obstacles, or other clutter, in the room. In some cases, this even allows a 3D representation to be generated for a room that has very little exposed wall space (e.g., a room in which one or more of the walls is occupied by a large piece of furniture) without the need to move any obstacles.

Figure 2:
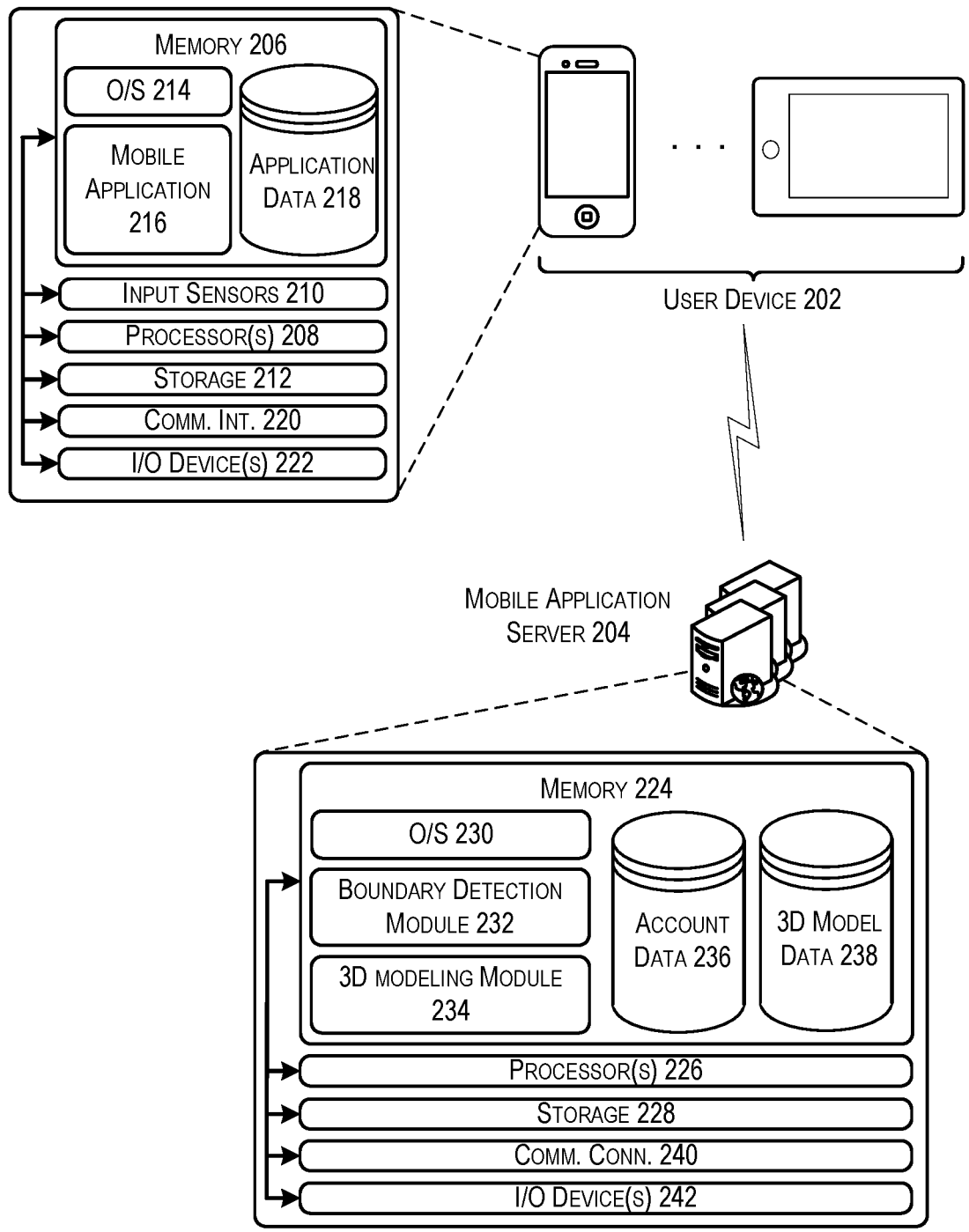
FIG. 2 depicts a system architecture for a system that may be implemented to perform the functionality described in accordance with at least some embodiments.

FIG. 2 depicts a system architecture for a system that may be implemented to perform the functionality described in accordance with at least some embodiments. In FIG. 2, a user device 202 may be in communication with a number of other components, including at least a mobile application server 204. The mobile application server 204 may perform at least a portion of the processing functions required by a mobile application installed upon the user device 202. The user device 202 may be an example of the user device 102 described in FIG. 1. The mobile application server 204 may be an example mobile application server 108 described with respect to FIG. 1.

A user device 202 may be any suitable electronic device that is capable of providing at least a portion of the capabilities described herein. In particular, the user device 202 may be any electronic device capable of identifying location information with respect to an indicated point. In some embodiments, a user device may be capable of establishing a communication session with another electronic device (e.g., mobile application server 204) and transmitting/receiving data from that electronic device. A user device may include the ability to download and/or execute mobile applications. User devices may include mobile communication devices as well as personal computers and thin-client devices. In some embodiments, a user device may comprise any portable electronic device that has a primary function related to communication. For example, a user device may be a smart phone, a personal data assistant (PDA), or any other suitable handheld device. The user device can be implemented as a self-contained unit with various components (e.g., input sensors, one or more processors, memory, etc.) integrated into the user device. Reference in this disclosure to an "output" of a component or an "output" of a sensor does not necessarily imply that the output is transmitted outside of the user device. Outputs of various components might remain inside a self-contained unit that defines a user device.

In one illustrative configuration, the user device 202 may include at least one memory 206 and one or more processing units (or processor(s)) 208. The processor(s) 208 may be implemented as appropriate in hardware, computer-executable instructions, firmware or combinations thereof. Computer-executable instruction or firmware implementations of the processor(s) 208 may include computer-executable or machine executable instructions written in any suitable programming language to perform the various functions described. The user device 202 may also include one or more input sensors 210 for receiving user and/or environmental input. There may be a variety of input sensors 210 capable of detecting user or environmental input, such as an accelerometer, a camera device, a depth sensor, a microphone, a global positioning system (e.g., GPS) receiver, etc. The one or more input sensors 210 may include at least a range camera (e.g., a depth sensor) capable of generating a range image, as well as a camera device configured to capture image information. The camera device may be a motion tracking camera, which is capable of maintaining location information with respect to the captured images.

For the purposes of this disclosure, a depth sensor (e.g., a range camera) may be any device configured to identify a distance or range of an object or objects from the depth sensor. In some embodiments, the depth sensor may generate a depth image (or range map), in which pixel values correspond to the detected distance for that pixel. The pixel values can be obtained directly in physical units (e.g., meters). In at least some embodiments of the disclosure, the 3D imaging system may employ a range camera that operates using structured light. In a depth sensor that operates using structured light, a projector projects light onto an object or objects in a structured pattern. The light may be of a range that is outside of the visible range (e.g., infrared or ultraviolet). The depth sensor may be equipped with one or more camera devices configured to obtain an image of the object with the reflected pattern. Distance information may then be generated based on distortions in the detected pattern. It should be noted that although this disclosure focuses on the use of a depth sensor using structured light, any suitable type of depth sensor, including those that operate using stereo triangulation, sheet of light triangulation, time-of-flight, interferometry, coded aperture, or any other suitable technique for range detection, would be useable by the described system.

The memory 206 may store program instructions that are loadable and executable on the processor(s) 208, as well as data generated during the execution of these programs. Depending on the configuration and type of user device 202, the memory 206 may be volatile (such as random access memory (RAM)) and/or non-volatile (such as read-only memory (ROM), flash memory, etc.). The user device 202 may also include additional storage 212, such as either removable storage or non-removable storage including, but not limited to, magnetic storage, optical disks, and/or tape storage. The disk drives and their associated computer-readable media may provide non-volatile storage of computer-readable instructions, data structures, program modules, and other data for the computing devices. In some implementations, the memory 206 may include multiple different types of memory, such as static random access memory (SRAM), dynamic random access memory (DRAM) or ROM. As used herein, the term "modules" may refer to programming modules executed by computing systems (e.g., processors) that are installed on and/or executed from a computing device such as the user device 202 or the mobile application server 204. Turning to the contents of the memory 206 in more detail, the memory 206 may include an operating system 214 and one or more application programs or services for implementing the features disclosed herein including at least a mobile application 216. The memory 206 may also include application data 218, which provides information to be generated by and/or consumed by the mobile application 216. In some embodiments, the application data 218 may be stored in a database.

For the purposes of this disclosure, a mobile application 216 may be any set of computer executable instructions installed upon, and executed from, a user device 202. Mobile applications may be installed on a user device by a manufacturer of the user device or by another entity. In some embodiments, the mobile application may cause a user device to establish a communication session with a mobile application server 204 that provides backend support for the mobile application. A mobile application server 204 may maintain account information associated with a particular user device and/or user. In some embodiments, a user may be required to log into a mobile application in order to access functionality provided by the mobile application. In some embodiments, the identity of the user can be determined and verified for purposes of logging into an account associated with the mobile application and associated with the user by using biometric information detected by the user device 202 (e.g., finger-print or thumb-print detection, facial recognition, iris scan, or the like).

In accordance with at least some embodiments, the mobile application 216 may be configured to, in conjunction with the processors 208, obtain depth information in relation to one or more points indicated by a user. In some embodiments, the mobile application 216 may cause the user device 202 to display on the user device's display an image captured by a camera of the mobile device. The user may select some point within the image (e.g., via a touchscreen) and the mobile application 216 may identify depth information that corresponds to the selected point. For example, both image information and depth information may be collected in parallel by the user device 202 via two different input sensors. The two sets of information may be correlated such that pixels in one set of information are associated with corresponding pixels in the other set of information. In this way, when a user selects a point within the image information, the depth information associated with the selected point may be determined. In some embodiments, the mobile application 216 may cause the depth information (as well as information associated with a position of the user device 102) to be transmitted to the mobile application server 204 for further processing. In some embodiments, the mobile application 216 may identify a boundary to be associated with each point selected by the user. An indication of each of the identified boundaries may then be transmitted to the mobile application server 204.

The user device 202 may also contain communications interface(s) 220 that enable the user device 202 to communicate with any other suitable electronic devices. In some embodiments, the communication interface 220 may enable the user device 202 to communicate with other electronic devices on a network (e.g., on a private network). The user device 202 may also include input/output (I/O) device(s) and/or ports 222, such as for enabling connection with a keyboard, a mouse, a pen, a voice input device, a touch input device, a display, speakers, a printer, etc.

In some embodiments, the user device 202 may communicate with the mobile application server 204 via a communication network. The communication network may include any one or a combination of many different types of networks, such as cable networks, the Internet, wireless networks, cellular networks, and other private and/or public networks. In addition, the communication network may comprise multiple different networks. For example, the user device 202 may utilize a wireless local area network (WLAN) to communicate with a wireless router, which may then route the communication over a public network (e.g., the Internet) to the mobile application server 204.

The mobile application server 204 may be any computing device or plurality of computing devices configured to perform one or more calculations on behalf of the mobile application 216 on the user device 202. In some embodiments, the mobile application 216 may be in periodic communication with the mobile application server 204. For example, the mobile application 216 may receive updates, push notifications, or other instructions from the mobile application server 204. In some embodiments, the mobile application 216 and mobile application server 204 may utilize a proprietary encryption and/or decryption scheme to secure communications between the two. In some embodiments, the mobile application server 204 may be executed by one or more virtual machines implemented in a hosted computing environment. The hosted computing environment may include one or more rapidly provisioned and released computing resources, which computing resources may include computing, networking, and/or storage devices. A hosted computing environment may also be referred to as a cloud-computing environment.

In one illustrative configuration, the mobile application server 204 may include at least one memory 224 and one or more processing units (or processor(s)) 226. The processor(s) 226 may be implemented as appropriate in hardware, computer-executable instructions, firmware or combinations thereof. Computer-executable instruction or firmware implementations of the processor(s) 226 may include computer-executable or machine executable instructions written in any suitable programming language to perform the various functions described.

The memory 224 may store program instructions that are loadable and executable on the processor(s) 226, as well as data generated during the execution of these programs. Depending on the configuration and type of mobile application server 204, the memory 224 may be volatile (such as random access memory (RAM)) and/or non-volatile (such as read-only memory (ROM), flash memory, etc.). The mobile application server 204 may also include additional storage 228, such as either removable storage or non-removable storage including, but not limited to, magnetic storage, optical disks, and/or tape storage. The disk drives and their associated computer-readable media may provide non-volatile storage of computer-readable instructions, data structures, program modules, and other data for the computing devices. In some implementations, the memory 224 may include multiple different types of memory, such as static random access memory (SRAM), dynamic random access memory (DRAM) or ROM. Turning to the contents of the memory 224 in more detail, the memory 224 may include an operating system 230 and one or more application programs or services for implementing the features disclosed herein including at least a module for identifying one or more boundaries that make up a space (boundary detection module 232), and a module for generating a 3D representation of a space (3D modeling module 234). The memory 206 may also include server-side databases, such as a database of account data 236 and/or a database of 3D representations 238.

The memory 224 and the additional storage 228, both removable and non-removable, are examples of computer-readable storage media. For example, computer-readable storage media may include volatile or non-volatile, removable or non-removable media implemented in any method or technology for storage of information such as computer-readable instructions, data structures, program modules or other data. The mobile application server 204 may also contain communications connection(s) 240 that allow the mobile application server 204 to communicate with a stored database, another computing device or server, user terminals, and/or other components of the described system. The mobile application server 204 may also include input/output (I/O) device(s) and/or ports 242, such as for enabling connection with a keyboard, a mouse, a pen, a voice input device, a touch input device, a display, speakers, a printer, etc.

Turning to the contents of the memory 224 in more detail, the memory 224 may include a boundary detection module 232, a 3D modeling module 234, a database of account data 236, and/or a database of 3D representations 238.

In some embodiments, the boundary detection module 232 may be configured to, in conjunction with the processors 226, receive depth information and potentially location information from the user device 202 and calculate a number of appropriate planes from the received data. In some embodiments, the boundary detection module 232 may receive depth information related to a point selected by a user as well as depth information for an area surrounding that point. Some example techniques for calculating a boundary from the received data are described below with respect to FIG. 4. In some embodiments, the 3D modeling module can receive from a user device 202 an indication of at least one of the identified boundaries and utilize each such indication to generate a 3D model of the corresponding space.

In some embodiments, the 3D modeling module 234 may be configured to, in conjunction with the processors 226, generate a 3D model of a space using the boundaries calculated by the boundary detection module 232. In some embodiments, this may involve identifying junctions at which boundaries intersect. In some cases, the 3D modeling module 234 may be configured to continue to receive boundary data until a number of junctions are identified so that each of the boundaries is limited in its extent by junctions (e.g., no boundary stretches for an infinite or extremely large length in any direction). In some embodiments, the 3D modeling module 234 may be a computer aided drafting application which has been configured to perform at least a portion of the techniques described herein.

Figure 3:
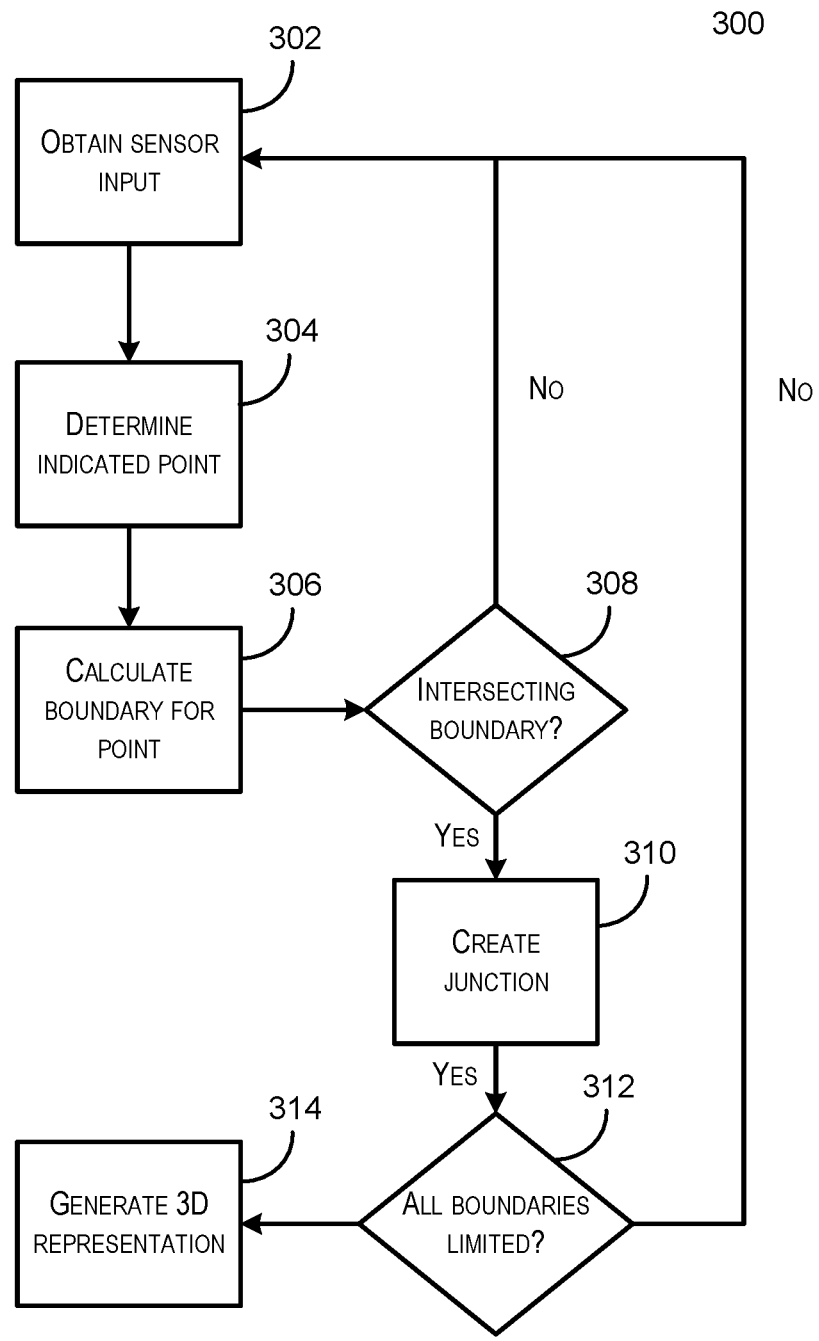
FIG. 3 depicts a flow chart that illustrates an example process for generating a 3D representation of a space that may be implemented in accordance with at least some embodiments.

FIG. 3 depicts a flow chart that illustrates an example process for generating a 3D representation of a space that may be implemented in accordance with at least some embodiments. Some or all of the process 300 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. Process 300 may be performed by an example user device 202, a mobile application server 204, and various other components, each of which is depicted with respect to FIG. 2, or can be performed using distributed processing techniques so that a combination of a user device 202, a mobile application server 204 and/or various other components, each of which performs only part of the overall process, cooperate to perform the overall process 300.

Process 300 may begin at 302, when the system receives sensor input, as well as position data, obtained from a user device. As described elsewhere, the sensor input may include image information as well as depth sensor output. In some embodiments, the sensor input may be received as a stream of data. For example, the input sensor data may be received as a video stream. In some embodiments, at least a portion of the process 300 described herein may be performed at a user device. For example, a user device may receive in parallel, via a depth sensor and a camera, both depth information and image information for a scene. In this example, the depth information and the image information may be associated, in that pixels within the depth information correspond to pixels within the depth information. The user device may further display the image information on its display.

At 304, input may be received which indicates a particular point. In some embodiments, the input is received via an indication on the display (e.g., a user's touch on a touchscreen device or a cursor selection of a point) with respect to image information. Based on this indication, a point within the depth information may be identified that corresponds to the point indicated with respect to the image information. For example, a pixel or pixels that are located in a position within the depth information that corresponds to the position of the indicated point within the image information may be determined. These pixels within the depth information may be assigned a value that corresponds to a depth or distance of the point from the user device.

At 306, a boundary may be calculated for the indicated point. An example of a technique that may be used to calculate a boundary for a given point within depth information is described below with respect to FIG. 4. The boundary may be identified and stored in memory as an equation or function. In some embodiments, a common point of reference (e.g., an origin point) may be identified such that any subsequently calculated boundary is calculated with respect to the common point of reference. In some embodiments, the common point of reference may be set to a position in space at which the user device was located at the time that the process 300 was initiated. Each boundary may be identified by the directions in which the boundary extends and an offset from the common point of reference.

At 308, it may be determined whether the calculated boundary intersects with one or more other boundaries calculated in a similar manner. If the boundary is determined not to intersect with another boundary (e.g., the one or more other boundaries are all parallel to the boundary) then the user device continues to obtain sensor input. If the boundary is determined to intersect with one or more other boundaries, then junctions may be determined for each intersecting boundary at 310. An example of a technique that may be used to determine whether a junction for two boundaries is described in greater detail below with respect to FIG. 5.

At 312, it may be determined whether the set of junctions is complete by determining whether or not all boundaries have been fully limited so they don't extend infinitely in any direction. A boundary may be limited by a junction in that any portion of the boundary which is separated from the indicated point on the boundary by a junction may be discarded or removed. This may be repeated for the boundary using a number of junctions. A boundary may be determined to be fully limited if the boundary has a finite length in each direction as defined by a junction. In some embodiments, a 3D representation of a space may be generated at 314 from the set of junctions and/or boundaries after determining that the set of junctions is complete.

Figure 4:
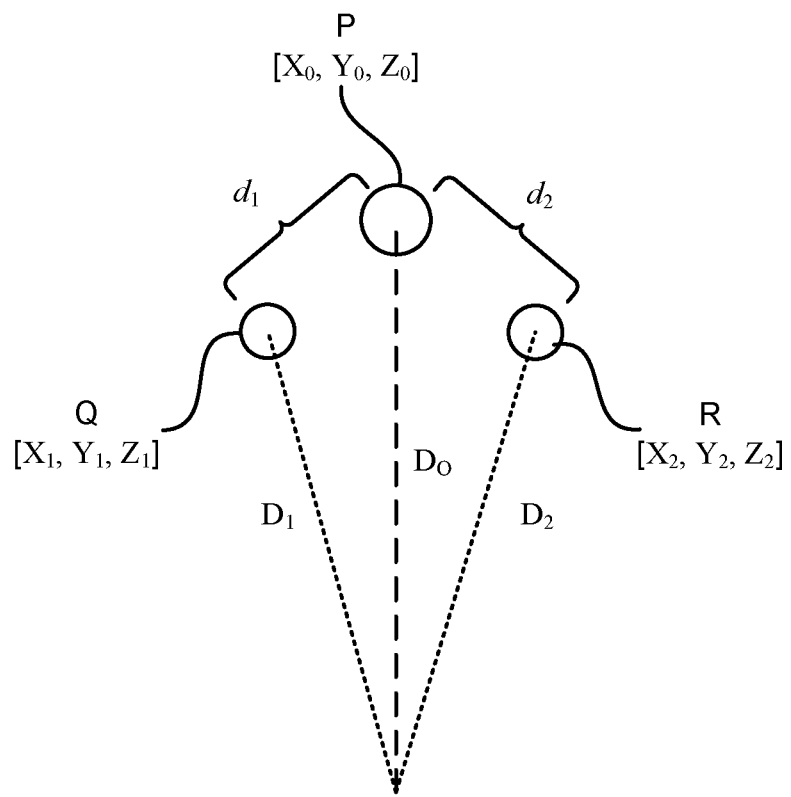
FIG. 4 depicts a technique for calculating boundary data using depth information received via a sensor on a user device in accordance with at least some embodiments.

FIG. 4 depicts a technique for calculating boundary data using depth information received via a sensor on a user device in accordance with at least some embodiments. For the purposes of this disclosure, a boundary may be any edge or border that bounds some portion of a 3D space. In some cases, a boundary may be defined by a plane or other flat surface. The techniques described with respect to FIG. 4 are directed to identifying a boundary that is defined by a plane. However, one skilled in the art would recognize that there are a number of ways of identifying boundaries that align with surfaces of structures, some of which may be applied to surfaces that are not planar or flat.

In FIG. 4, a boundary origin point P may be selected by a user. In some embodiments, the boundary origin point may be selected by the user on a user device by selecting a point corresponding to that boundary origin point within image information displayed on the user device. After selection of the boundary origin point P, the user device may, using a depth sensor, collect depth information for points immediately surrounding the boundary origin point P. For example, the user device may collect depth information for points Q and R so that points Q and R form a 90° angle with respect to the boundary origin point P (though a 90° angle is not required to determine a boundary). The points Q and R may be selected such that some distance $d_1$ between point Q and the boundary origin point P is equal to the distance $d_2$ between point R and the boundary origin point P (e.g., such that each of $d_1$ and $d_2$ represents one unit of length). Additionally, $D_o$ is a depth (i.e., a distance) associated with the boundary origin point P, $D_1$ is a depth associated with point Q, and $D_2$ is a depth associated with point R. The user device may calculate coordinates for each of the points with respect to space (e.g., coordinates along an X, Y, and Z axis). In some embodiments, the coordinates for the three points may be determined with respect to some point of origin common to each of the boundaries to be generated. For example, the coordinates for the three points may be determined with respect to a position of a user device upon initiation of the techniques described. To determine coordinates of the three points, the user device may use orientation data (e.g., obtained from a compass of the user device) and depth information to determine a distance and direction for each of the points to the user device.

By way of illustrating one embodiment of the techniques described herein, the system may select three points in space as $[X_0, Y_0, Z_0]$, $[X_1, Y_1, Z_1]$, and $[X_2, Y_2, Z_2]$. In this example, the system may identify vectors associated with the points and then find a cross product between those vectors. By way of illustration, vector $\overline{PQ}$ may be identified as $[X_1-X_0, Y_1-Y_0, Z_1-Z_0,]$ and vector $\overline{PR}$ may be identified as $[X_2-X_0, Y_2-Y_0, Z_2-Z_0,]$. A cross product may then be calculated for vectors $\overline{PQ}$ and $\overline{PR}$ in order to determine a normal vector (e.g., a vector which is perpendicular to a boundary that includes the vectors $\overline{PQ}$ and $\overline{PR}$). The normal vector may then be used along with one of the points to calculate an equation for the boundary. For example, if the normal vector is $[X_N, Y_N, Z_N]$, then the equation for the boundary (a planar boundary in this example) is:

$$X_N(X-X_0)+Y_N(Y-Y_0)+Z_N(Z-Z_0)=0$$

It should be noted that a number of techniques can be used to identify a boundary that includes a boundary origin point P using depth sensor and orientation information from a user device.

Figure 5:
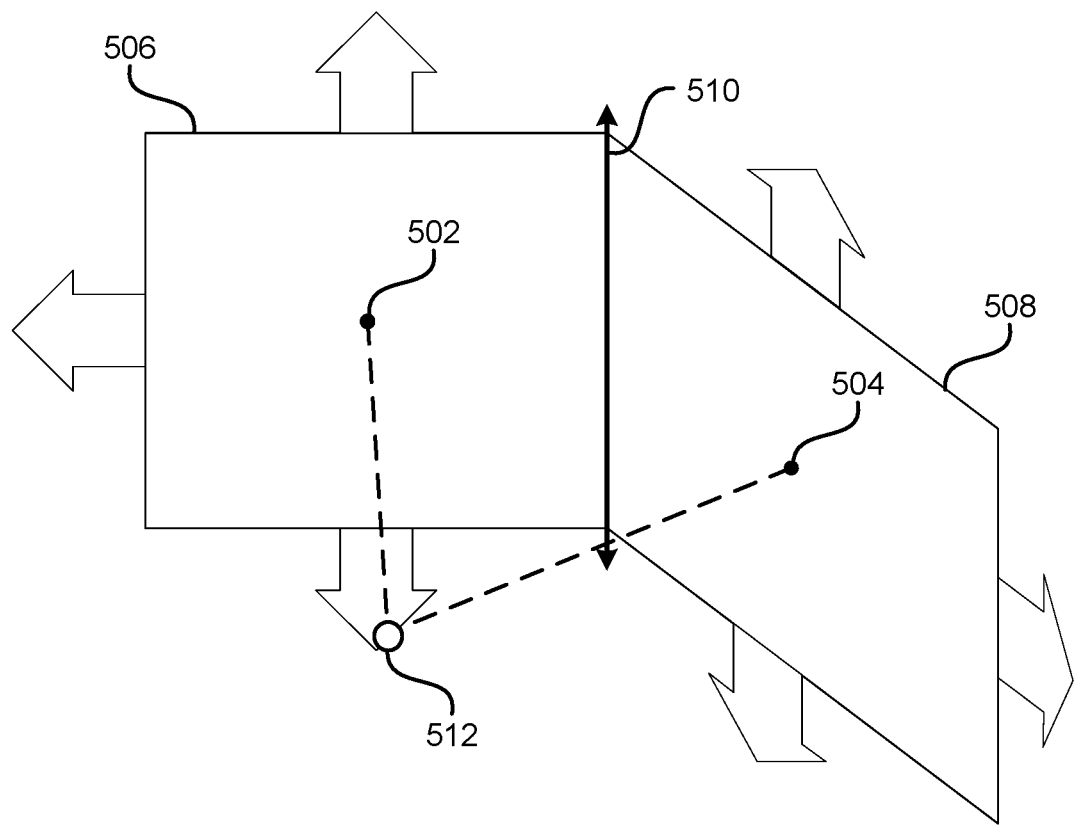
FIG. 5 depicts a technique for calculating a junction for two surfaces with respect to a common origin point in accordance with at least some embodiments.

FIG. 5 depicts a technique for calculating a junction for two planar boundaries with respect to a common origin point in accordance with at least some embodiments. In FIG. 5, the system may identify two or more boundaries relevant to a space. In some embodiments, the system may determine functions that each represent a boundary with respect to two different boundary origin points as described with respect to FIG. 4 above. For example, a user may select two boundary origin points 502 and 504. The system may then generate respective planar boundaries 506 and 508, or functions which represent the boundaries, in accordance with the techniques described above. The generated boundaries 506 and 508 may be boundless, in that each of the boundaries may continue for an infinite length in each direction.

A junction 510 that bounds part of the two boundaries 502 and 504 is a line that lies within both boundaries. To bound the boundaries using the junction, the portions of the boundaries 506 and 508 which are separated from the two boundary origin points 502 and 504 by the junction are discarded or removed. In some embodiments, the junction 510 may be calculated by setting the equations representing each of the respective boundaries equal to each other. It should be noted that a junction may only be identified for two boundaries that are not parallel (i.e., the two boundaries must intersect at some point). It should also be noted that if the junction of the boundaries is a large distance away from the origin (e.g., greater than some threshold distance), then the boundaries may be considered parallel for the purposes of this disclosure. In this case, the system may determine that additional junctions are needed before the boundaries can be considered limited in their extent.

In some embodiments, the system may maintain an indication of a point of origin 512 that is common to each of the boundaries. In some embodiments, the point of origin 512 may be determined as a point in space of a user device that initiated the techniques described herein. In some embodiments, the user device may use a motion tracking camera (e.g., a camera that includes accelerometers and a compass) to keep track of the point of origin 512 with respect to a current position (e.g., orientation and location) of the user device. Each boundary selected by a user may be identified with respect to the point of origin 512. In this way, a user is able to move the user device around without losing the relative position of each identified boundary.

Figure 6:
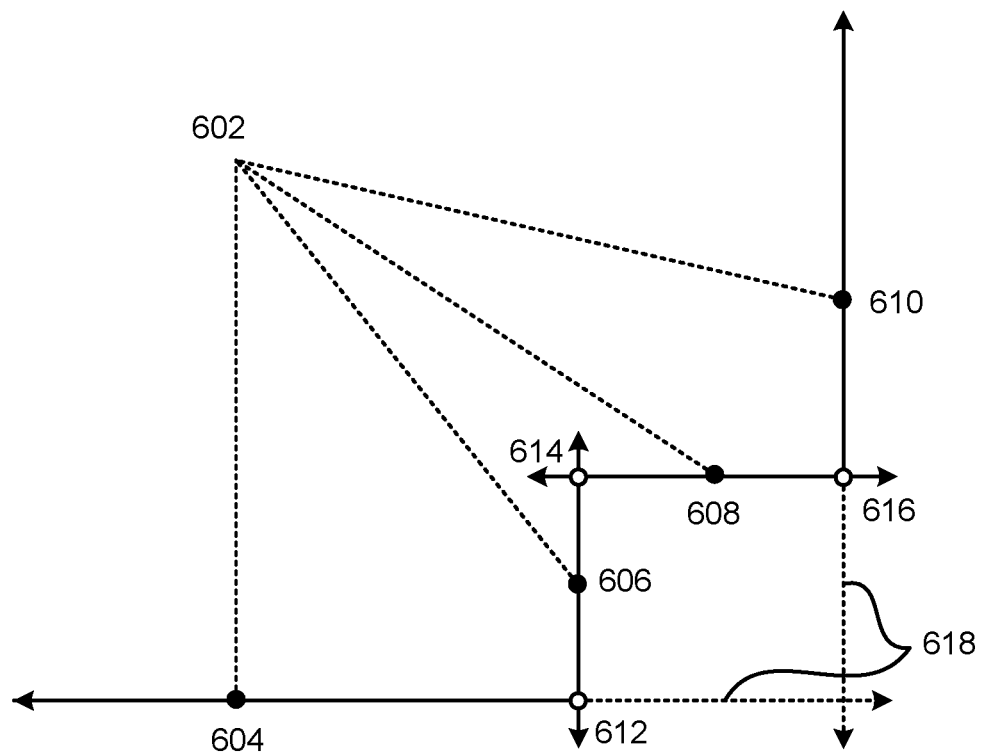
FIG. 6 depicts a technique for bounding surfaces using calculated junction information in accordance with at least some embodiments.

FIG. 6 depicts a technique for generating a model of a space by bounding boundaries using calculated junction information in accordance with at least some embodiments. In FIG. 6, a space is depicted as having an atypical structure. An atypical structure is a structure that varies from a conventional structure in that it includes some anomaly (e.g., a protrusion or depression) that does not commonly occur. In the example depicted in FIG. 6, a protrusion is depicted as being within a corner of the space. To generate a 3D representation of this corner, a user may initiate a mobile application on his or her user device at point 602. The user may then view image information related to the space to be mapped on a user device via a graphical user interface (GUI) of the mobile application. Although the space is depicted as two dimensional (in a manner similar to a partial floor-plan), it should be noted that the space represents a three dimensional area. The user may then select image information that corresponds to each of points 604, 606, 608, and 610. Depth sensor output, as well as positional information associated with the user device, may then be used to identify actual points 604, 606, 608, and 610 within the space. It should be noted that although the information generated with respect to this process may be generated in relation to point 602, the user may be free to move around the space and select points from different angles.

After all of points 604, 606, 608, and 610 have been selected by the user, boundaries corresponding to each of those points may be identified. Example techniques for identifying a boundary with respect to a selected point (e.g., a boundary origin point) are described elsewhere in this disclosure. Once a number of boundaries have been generated with respect to points 604, 606, 608, and 610, junctions may be determined with respect to each intersection of two boundaries. Example techniques for generating junctions with which to bound boundaries are also described elsewhere in this disclosure.

In some embodiments, a 3D representation of a space may be generated by bounding the space using a number of boundaries and junctions. To do this, the user may need to select a boundary for every surface of a structural feature within the room (e.g., walls, ceiling, floor, beam, etc.). In some embodiments, the 3D representation may be considered incomplete if one or more boundaries are left with their extent unlimited in any direction. In some embodiments, as a user selects a new point, the system generates a boundary associated with that point and extends that boundary in all directions either until it intersects another boundary (e.g., at a junction) or ad infinitum (or up to a maximum distance). Where the boundary meets another boundary, both of the intersecting boundaries are limited in extent such that the portion of the boundary which is separated from the selected point (e.g., points 604, 606, 608, and 610) is removed. In some embodiments, a boundary may be limited in its extent more than once. For example, a user may select points 604 and 610 prior to selecting points 606 and 608. In this example, the boundaries corresponding to points 604 and 610 may first be limited based on the intersection of those two boundaries. Once the user has subsequently selected points 606 and 608, the boundaries may be limited again such that the portion of the boundaries (e.g., 618) that lie between the new junction and the previous junction may be discarded. In this way, a 3D representation may be updated to include an indication of an atypical structural feature.

Using the techniques described herein, a user may map any space composed of any combination of boundaries. It should be noted that the FIG. 6 depicts an atypical structure in that the space includes multiple parallel boundaries which are offset. Such an atypical structure is likely to be mistaken as clutter by a conventional space modeling system. Hence, embodiments of the current system are advantageous over such conventional systems.

Figure 7:
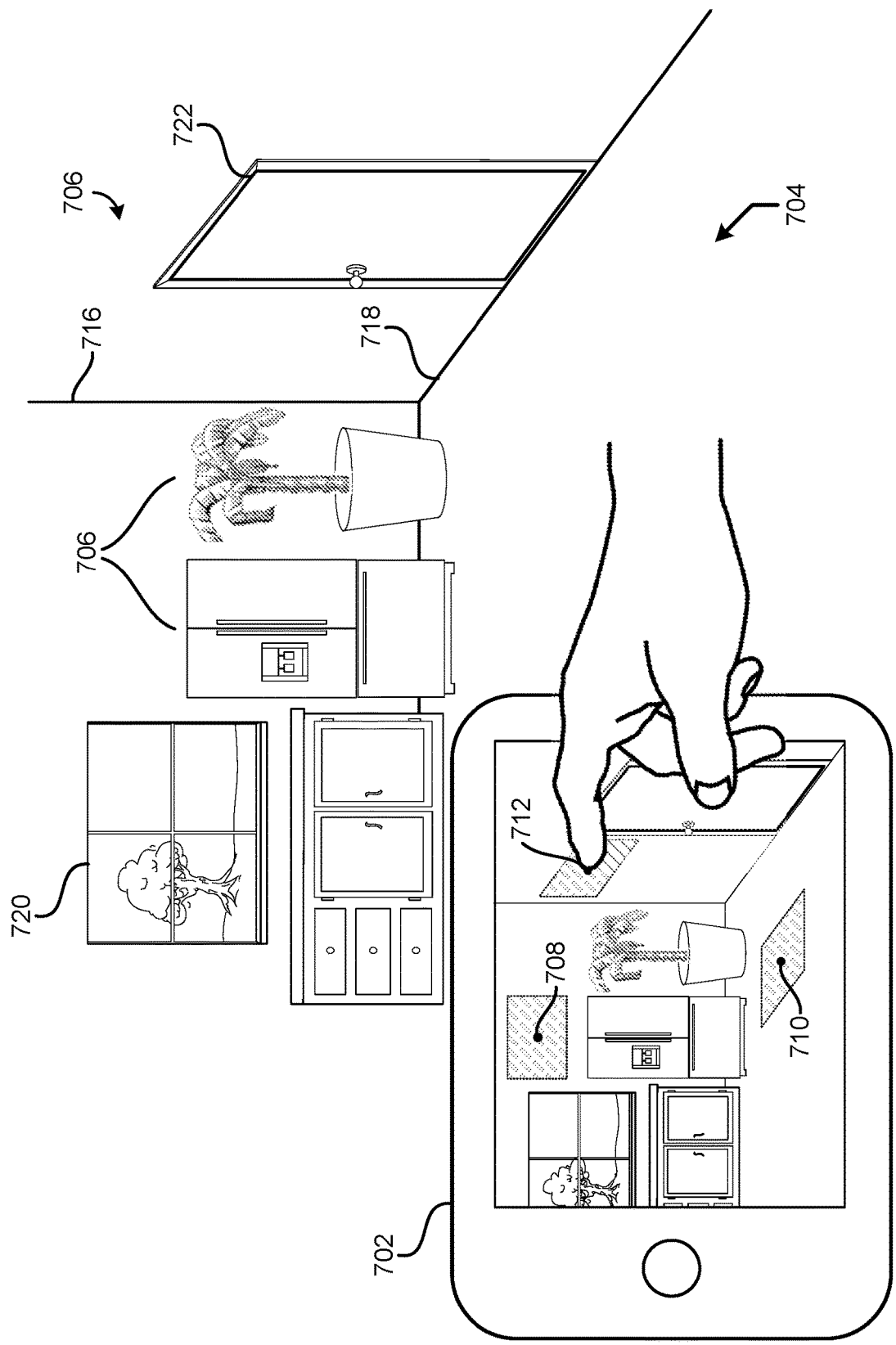
FIG. 7 depicts an illustrative example of an interaction that may occur using the system described herein in accordance with at least some embodiments.

FIG. 7 depicts an illustrative example of an interaction that may occur using the system described herein in accordance with at least some embodiments. In FIG. 7, a user device 702 is depicted as being used to capture image information related to a scene 704. In FIG. 7, the scene 704 for which image information has been captured includes a number of obstacles 706 that block a view of at least a portion of some structures. In some embodiments, the functionality described with respect to FIG. 7 may be enabled via a mobile application installed upon the user device 702.

As depicted in FIG. 7, a user is able to select several points 708, 710, and 712 which correspond to unobstructed portions of a surface of a structural feature. The system may be configured to generate, after receiving an indication of the points 708, 710 and 712, corresponding boundaries that match the surface of the corresponding structural feature for at least some amount of area. This is described in greater detail with respect to FIG. 4 above. When these boundaries are extended outward, the system may determine one or more junctions at which the generated boundaries intersect. For example, if the boundary corresponding to point 712 and the boundary corresponding to point 708 are each extended until they intersect, the system would approximate the corner 716 of the room without needing to receive an indication of that corner from the user and despite any obstacles that may be obstructing a view of the corner. Similarly, if the boundary corresponding to point 712 and the boundary corresponding to point 710 are each extended until they intersect, the system would approximate the corner 718 of the room. Information determined for each of these corners 716 and 718 may be stored as junctions.

In some embodiments, the mobile application installed upon the user device 102 may enable a user to mark locations of various structural features. For example, the user may mark the location of a window 720 or a door 722. In this example, the user may mark each of the corners of the respective window 720 or door 722 in order to identify the bounds of the feature. The system may then add the indicated structural features to any subsequently generated 3D representation of the space 704. In some embodiments, the system may also store an indication of one or more obstacles 706 and its respective location within the space 704.

Figure 8:
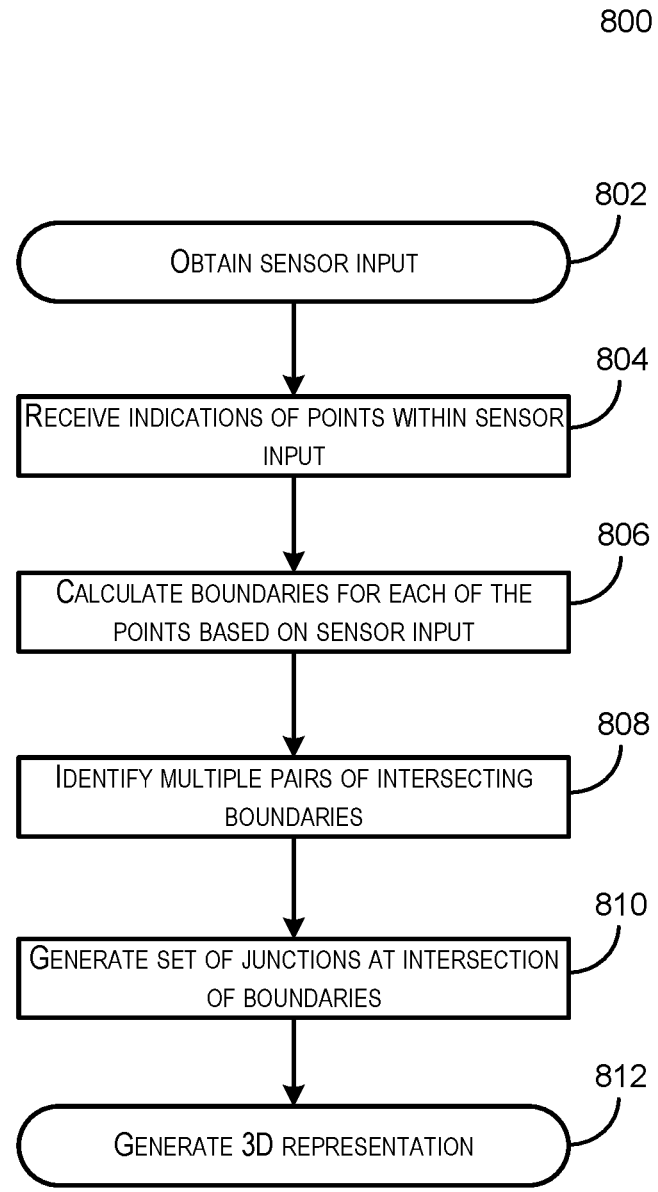
FIG. 8 depicts a flow diagram which illustrates an example process for generating a 3D representation of a space using depth and image information obtained with respect to the space in accordance with at least some embodiments.

FIG. 8 depicts a flow diagram which illustrates an example process for generating a 3D representation of a space using depth and image information obtained with respect to the space in accordance with at least some embodiments. Process 800 may be performed using some combination of a user device 202 and/or a mobile application server 204, each of which is depicted with respect to FIG. 2.

Process 800 may begin at 802 when sensor output is received. In accordance with at least some embodiments, the sensor output may include at least image information as well as depth information. The sensor output may be obtained using multiple sensor devices installed on a single user device. In some embodiments, the sensor output may be received as streaming data (e.g., data that is constantly updated). In some embodiments, the sensor output may be received as a single still image.

At 804, the process may involve receiving indications of points within the obtained sensor output. In some embodiments, the indication can be received via a touch on a display of the user device at a point within image information. Based on this indication, a point within the depth information may be identified that corresponds to the point indicated with respect to the image information. For example, a determination can be made that pixel or pixels that are located in a position within the depth information correspond to the position of the indicated point within the image information.

At 806, the process may involve calculating boundaries (planar boundaries in this example) for each of the indicated points. An example of a technique that may be used to calculate a boundary for a given point within depth information is described above with respect to FIG. 4. In some embodiments, each boundary may be represented by an equation or function. It should be recognized that one skilled in the art would be aware of a number of techniques for finding a line or junction that exists at the intersection of two intersecting boundaries.

At 808, the process may involve identifying multiple pairs of intersecting boundaries within the calculated boundaries. An example of a technique that may be used to determine whether a junction for two boundaries is described in greater detail above with respect to FIG. 5. The process 800 may involve identifying one junction for each intersecting pair of boundaries. It should be noted that a junction may be removed from the set of junctions after determining that it is outside of the bounds of the space (e.g., another junction has caused the junction to no longer bound any boundaries).

At 810, the process may involve generating a set of junctions based on intersections between each pair of intersecting boundaries. At 812, the process may involve generating a 3D representation from the junctions in the set of junctions, the suitably limited boundaries, or some combination of the two. In some embodiments, this step may be performed used a computer aided drafting (CAD) application.

Figure 9:
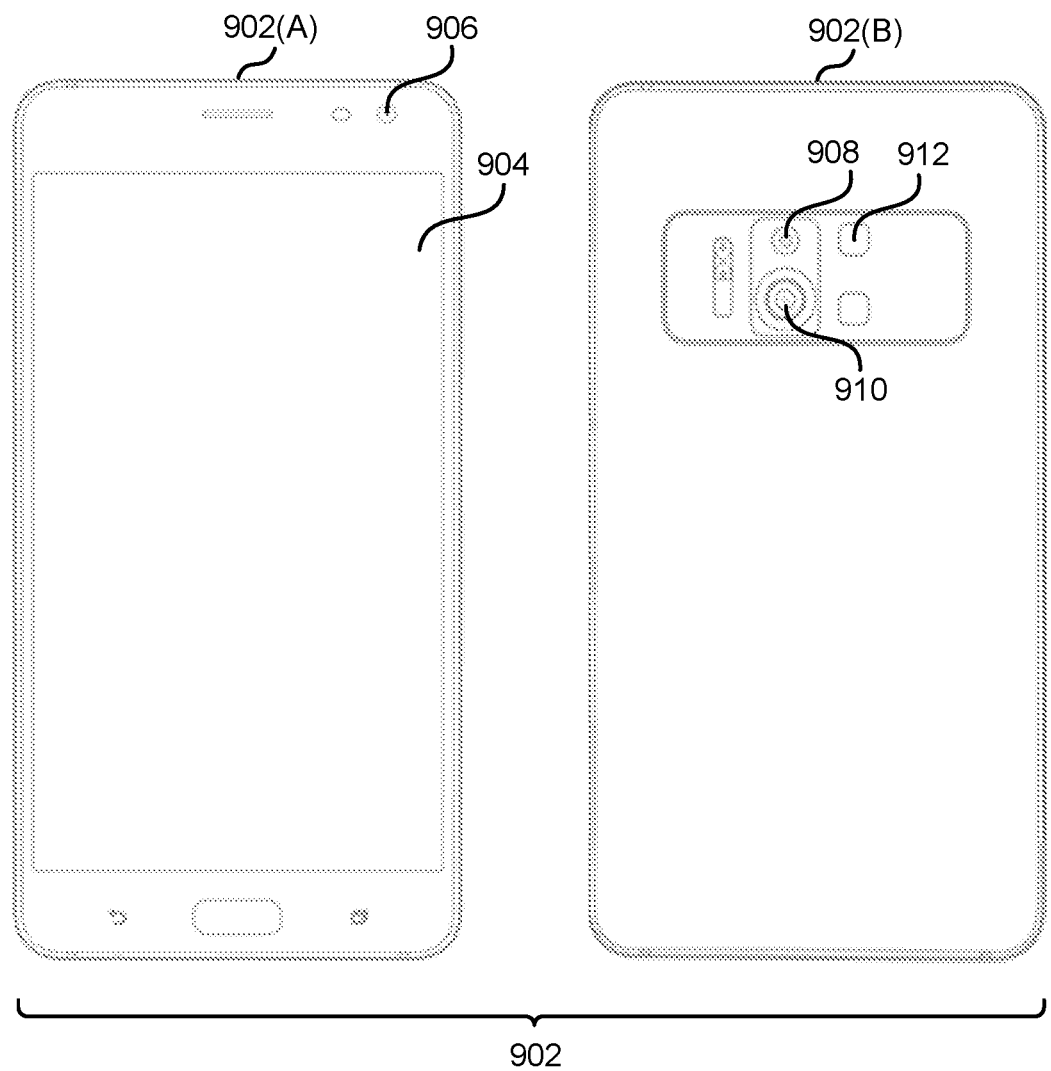
FIG. 9 depicts an illustrative example of a user device capable of performing at least a portion of the functionality described herein.

FIG. 9 depicts an illustrative example of a user device capable of performing at least a portion of the functionality described herein. In FIG. 9, a front 902(A) and back 902(B) is depicted for a user device 902. The depicted user device 902, as may be used in some particular embodiments of the system described herein, may be a ZENFONE AR (ZS571KL) smartphone device manufactured by ASUS corporation or a PHAB 2 PRO smartphone device manufactured by LENOVO corporation.

As depicted in FIG. 9, the user device 902 may include a display screen 904 capable of displaying image information to a user of the user device 902. Additionally, the user device 902 may include a number of camera devices. For example, the user device 902 may include a front-facing camera 906. Additionally, the user device 902 may include multiple rear-facing cameras, each of which serves different purposes. For example, the rear-facing cameras of the user device 902 may include both a high-resolution camera device 908 for capturing detailed images, a motion tracking camera 910 for tracking the user device's location as it moves through space while capturing image information, and a depth sensor camera 912 for capturing depth information associated with a captured image information.

Although the foregoing examples demonstrate use of the foregoing systems and processes on planar boundaries, the foregoing systems and processes are not limited to uses on flat, planar boundaries. Those systems and processes can be adapted for use on non-planar boundaries that meet with other boundaries at one or more junctions. For curved surfaces, for example, the systems and processes can receive an indication from a user of a point on a curved boundary (e.g., based on a touch at the corresponding point on the display screen where an image of the curved surface appears) and an indication (through menu options and/or a touch or click, or otherwise) that the boundary is curved. The system and process can prompt the user to select at least three more points at different locations on the same boundary using any one or more of the previously described systems and techniques. The systems and processes then can calculate (e.g., through suitable programming and processing) a Bezier curve that represents the boundary's curvature and generate (based on junctions and/or other surfaces determined using the foregoing systems and processes and the Bezier curve) a 3D representation of the curved surface.

In some embodiments, a boundary may be defined by a plane (e.g., an infinitely large flat surface). In some embodiments, the boundary may be defined by a non-flat surface. For example, the boundary may be defined by a curve created using some function. By way of illustration, a boundary may be defined by a Bezier curve. In at least some of these embodiments, a function may be created by obtaining points along a surface and fitting a function to those points. This may involve obtaining multiple points along the same surface to act as control points for a curve. For example, a user may select a number of points on a curved surface. In this example, a relative depth of each of the points and/or a curvature at each point may be determined using depth sensor data in the manners described above. The positions of the selected points may then be used to create a polynomial (e.g., a Bernstein polynomial) that defines a curve.

In some embodiments, multiple curves may be defined for a single surface that are used to create a composite curve. A boundary associated with the surface may then be defined by the composite curve. For example, a curvature of a surface may be determined for each of multiple points along a surface. In this example, a low order polynomial may be fitted to each of the points along the surface. The low order polynomials may then be combined to create a composite curve (e.g., a "path").

By way of illustration, consider a scenario in which a user wishes to define a boundary for a curved wall within a room. Assume, for this scenario, that the wall curves around a vertical axis. In this scenario, the user may, instead of selecting a single point on that surface, select four points along the surface. The four points may be at the same relative height on the wall or at different heights. In this example, depth information collected with respect to each of the selected points may be used to fit a Bezier curve to the surface of the wall. A boundary may then be determined as being defined by the Bezier curve.

Additionally, the user device 902 may include software that, in conjunction with a number of processors of the user device 902, provides at least a portion of the functionality described herein. For example, the software application TANGO, which is developed by GOOGLE corporation, enables motion tracking, area learning, and depth perception functionality on the depicted user device 902. A mobile application, as described herein, which is installed upon the user device 902 may use one or more of these functionalities by performing an API or method call in accordance with TANGO specifications. Accordingly, it should be noted that the system described herein is fully enabled by the combination of hardware and software depicted.

Embodiments of the invention provide for a number of technical advantages over conventional systems. Conventional systems which generate 3D representations of a space often use devices (e.g., LIDAR) that scan an entire space as well as all of the items within that space. This results in the collection of a large amount of point cloud data, some of which is not actually part of the space. Unlike conventional systems that obtain a large amount of point cloud data to be processed in order to generate a 3D representation of a space, the system described herein is able to generate a 3D representation of that same space while minimizing the amount of data needed. Furthermore, the system described herein is able to generate a 3D representation of a space regardless of any amount of clutter within the space, so long as each surface of important structural features of the space is at least partially exposed.

Furthermore, because the system described herein uses a user-guided approach to identifying bounds of the space, the system is able to account for structural features that conventional systems are not able to address. For example, conventional systems are often unable to distinguish atypical structural features (e.g., beams, protrusions, depressions, etc.) from obstacles or clutter. The current system is able to account for these atypical structural features using guidance provided by a user. For example, in the system described herein, a user may indicate each surface of each structure, even atypical structures, which may then be reflected within a 3D representation generated using the system. Conventional systems often require that an initial 3D representation generated by the system be manually altered by a user to include any atypical structural feature. This can result in a loss of accuracy, as users may not accurately generate the feature within the representation.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C#, or C++, or any scripting language, such as Perl, Python, or TCL, as well as combinations thereof. The server(s) may also include database servers, including without limitation those commercially available from Oracle Microsoft Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A method of generating a three-dimensional (3D) representation of a space comprising:
   receiving an indication of a number of points, each of the points corresponding to a location upon a surface of a structural feature within the space;
   determining, for each of the number of points, a number of corresponding boundaries that match the surface of the corresponding structural feature for at least some amount of area;
   identifying, from the determined number of corresponding boundaries, multiple pairs of intersecting boundaries;
   generating a set of junctions, wherein each junction is generated as an intersection of a pair of intersecting boundaries of the multiple pairs of intersecting boundaries; and
   after determining that each of the number of corresponding boundaries are completely limited in extent by junctions within the set of junctions, generating the 3D representation of the space using the set of junctions.

2. The method of claim 1, wherein each of the points are determined to correspond to the location upon the surface of the structural feature based on depth information received in relation to the point.

3. The method of claim 2, wherein the depth information received in relation to the point corresponds to image information.

4. The method of claim 2, wherein the depth information is obtained via a depth sensor installed upon a user device.

5. The method of claim 1, wherein the 3D representation is (i) a wireframe model of the space or (ii) generated by a computer aided drafting application using the set of junctions.

6. The method of claim 1, wherein each of the junctions in the set of junctions is generated after identifying at least one of the multiple pairs of intersecting boundaries.

7. The method of claim 1, wherein the indication of the number of points is received from a user interface of a user device.

8. The method of claim 1, wherein the 3D representation is caused to be generated by a mobile application server.

9. A system comprising:
   one or more camera devices;
   a processor; and
   a memory including instructions that, when executed with the processor, cause the system to, at least:
      obtain, from the one or more camera devices, depth information associated with a scene;
      receive an indication of a point within the depth information;
      calculate, using the depth information, a first boundary associated with the point;
      determine one or more bounds for the first boundary based on at least one second boundary that is obtained in relation to the scene and that intersect with the first boundary; and generate a three-dimensional (3D) representation of the scene based at least in part on the one or more bounds.

10. The system of claim 9, wherein the one or more camera devices are in a user device and wherein the processor and the memory are in a mobile application server in communication with the user device.

11. The system of claim 9, wherein the 3D representation of the scene includes at least a representation of an atypical structural feature.

12. The system of claim 11, wherein the atypical structural feature is one of a beam, protrusion, or depression.

13. The system of claim 9, wherein the first boundary matches a surface of a structural feature for at least some portion of distance.

14. The system of claim 13, wherein the second boundary matches a second surface of the structural feature for at least some portion of distance.

15. An apparatus comprising:
a camera device;
a depth sensor device;
a mobile application stored in a computer-readable medium that, when executed, causes the apparatus to, at least:
receive depth information from the depth sensor device which corresponds to image information captured using the camera device;
receive an indication, via the image information, of a first point and a second point within the depth information;
identify, using the depth information, a first boundary associated with the first point and a second boundary associated with the second point within the depth information;
determine a junction as a line on which the first boundary and second boundary intersect; and
cause a three-dimensional (3D) model to be generated that includes at least the determined junction.

16. The apparatus of claim 15, wherein the apparatus further comprises a display and the indication of the first point and the second point are received as a selection of corresponding points on the display.

17. The apparatus of claim 15, wherein the 3D model is of a bounded space that the apparatus is within.

18. The apparatus of claim 15, wherein the first point and the second point are on different surfaces of one or more structural features.

19. The apparatus of claim 18, wherein a position of the first point and a position of the second point are indicated in relation to a single point of origin.

20. The apparatus of claim 15, wherein the 3D model is caused to be generated by a mobile application server.

* * * * *